United States Patent
Shi

(10) Patent No.: US 9,899,462 B2
(45) Date of Patent: Feb. 20, 2018

(54) MANUFACTURING METHOD FOR OLED DISPLAY PANEL

(71) Applicant: Shenzhen China Star Optoelectronics Technology Co., Ltd., Shenzhen, Guangdong (CN)

(72) Inventor: Longqiang Shi, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 54 days.

(21) Appl. No.: 14/907,647

(22) PCT Filed: Dec. 30, 2015

(86) PCT No.: PCT/CN2015/099644
§ 371 (c)(1),
(2) Date: Jan. 26, 2016

(87) PCT Pub. No.: WO2017/063295
PCT Pub. Date: Apr. 20, 2017

(65) Prior Publication Data
US 2017/0236889 A1    Aug. 17, 2017

(30) Foreign Application Priority Data
Oct. 12, 2015 (CN) .......................... 2015 1 0659257

(51) Int. Cl.
*H01L 27/00* (2006.01)
*H01L 51/00* (2006.01)
(Continued)

(52) U.S. Cl.
CPC ...... *H01L 27/3276* (2013.01); *H01L 27/3246* (2013.01); *H01L 51/0005* (2013.01);
(Continued)

(58) Field of Classification Search
CPC ............ H01L 27/3276; H01L 27/3246; H01L 27/1214; H01L 27/3244; H01L 51/0005;
(Continued)

(56) References Cited

U.S. PATENT DOCUMENTS

2005/0040756 A1    2/2005 Winters et al.
2005/0073230 A1    4/2005 Nishikawa et al.
(Continued)

FOREIGN PATENT DOCUMENTS

| JP | 20020207114 A | 7/2002 |
|----|---------------|--------|
| JP | 4226388 A | 2/2009 |
| KR | 1020150055375 A | 5/2015 |

*Primary Examiner* — Nikolay Yushin
(74) *Attorney, Agent, or Firm* — Andrew C. Cheng

(57) ABSTRACT

The present disclosure provides an OLED display panel and a manufacturing method thereof. The OLED display panel includes a substrate and a bank layer and pixel units disposed on the substrate. The pixel units are partitioned by the bank layer. The bank layer is negative photoresist. Openings obtained by exposing and developing the bank layer are formed in the bank layer. The openings are used for placing light-emitting layers of the pixel units. A light-permeable light enhancement layer is disposed between the bank layer around the opening and the substrate, such that light intensity on one side of the bank layer around the opening close to the substrate is increased during the exposure and development process to obtain the opening having a top wider than a bottom. By using the present disclosure, a manufacturing efficiency of the light-emitting layers of the OLEDs increases.

5 Claims, 3 Drawing Sheets

(51) Int. Cl.
*H01L 27/32* (2006.01)
*H01L 51/52* (2006.01)
*H01L 51/56* (2006.01)

(52) U.S. Cl.
CPC .......... *H01L 51/5203* (2013.01); *H01L 51/56* (2013.01); *H01L 2227/323* (2013.01)

(58) Field of Classification Search
CPC ................ H01L 51/5203; H01L 51/56; H01L 2227/323; H01L 2227/326
See application file for complete search history.

(56) References Cited

U.S. PATENT DOCUMENTS

| | | |
|---|---|---|
| 2005/0140277 A1 | 6/2005 | Suzuki et al. |
| 2010/0051973 A1 | 3/2010 | Kobayashi et al. |
| 2014/0159012 A1 | 6/2014 | Song et al. |
| 2014/0168572 A1 | 6/2014 | Iwata et al. |
| 2016/0133682 A1* | 5/2016 | Kim .................... H01L 27/3248 257/72 |
| 2017/0162638 A1* | 6/2017 | Nendai ............... H01L 27/3246 |

* cited by examiner

MANUFACTURING METHOD FOR OLED DISPLAY PANEL

BACKGROUND OF THE INVENTION

1. Field of the Invention

The present invention relates to a display technology, more particularly, to an organic light-emitting diode (OLED) display panel and a manufacturing method thereof.

2. Description of the Related Art

Currently, OLED display panels have gradually become the mainstream of the display area. In the existing manufacturing processes of OLED display panels, light-emitting layers of OLEDs are usually formed by using the inkjet printing technology. Generally speaking, an OLED display panel comprises pixel units and a bank layer used for partitioning the pixel units. The bank layer is negative photoresist. During the manufacturing process, the bank layer is disposed on the substrate, and the bank layer is exposed to obtain plural opening patterns. An OLED light-emitting material is sprayed into the openings to form the light-emitting layers of the pixel units.

However, since the exposure energy contacted by an upper part of the bank layer is higher than that contacted by a bottom part of the bank layer when the bank layer is exposed, the opening patterns formed by exposure tend to become the structure having a narrow top and a wide bottom as shown in FIG. 1. Hence, in the subsequent inkjet printing process, the OLED light-emitting material is difficult to enter into the openings because of the narrow top of the openings, thus resulting in a poor manufacturing efficiency of the light-emitting layers of the OLEDs.

SUMMARY OF THE INVENTION

The present disclosure provides an OLED display panel and a manufacturing method thereof to increase a manufacturing efficiency of light-emitting layers of the OLEDs.

The present disclosure provides an OLED display panel. The OLED display panel comprises a substrate and a bank layer and a plurality of pixel units disposed on the substrate. The plurality of pixel units are partitioned by the bank layer. Each of the pixel units comprises a cathode, an anode, and a light-emitting layer sandwiched between the cathode and the anode. The bank layer is negative photoresist and a plurality of openings obtained by exposing and developing the bank layer are formed in the bank layer. The openings are used for placing light-emitting layers of the pixel units, and a light-permeable light enhancement layer is disposed between the bank layer around the opening and the substrate, such that light intensity on one side of the bank layer around the opening close to the substrate is increased during the exposure and development process to obtain the opening having a top wider than a bottom. The light enhancement layer is made of a semi-reflective translucent material or constituted by a brightness enhanced film. The light enhancement layer extends to an area corresponding to the bottom of the opening. An extended portion of the light enhancement layer completely or partially covers the area corresponding to the bottom of the opening.

In one aspect of the present disclosure, the anode of the pixel unit comprises an indium tin oxide (ITO) electrode, the ITO electrode is disposed on the bottom of the opening, two ends of the ITO electrode are disposed in the bank layer, and the light enhancement layer is disposed between the ITO electrode and the substrate.

In another aspect of the present disclosure, the light-emitting layers are formed by inkjet printing.

The present disclosure also provides an OLED display panel. The OLED display panel comprises a substrate and a bank layer and a plurality of pixel units disposed on the substrate. The plurality of pixel units are partitioned by the bank layer. Each of the pixel units comprises a cathode, an anode, and a light-emitting layer sandwiched between the cathode and the anode. The bank layer is negative photoresist and a plurality of openings obtained by exposing and developing the bank layer are formed in the bank layer. The openings are used for placing light-emitting layers of the pixel units, and a light-permeable light enhancement layer is disposed between the bank layer around the opening and the substrate, such that light intensity on one side of the bank layer around the opening close to the substrate is increased during the exposure and development process to obtain the opening having a top wider than a bottom.

In one aspect of the present disclosure, the light enhancement layer is made of a semi-reflective translucent material or constituted by a brightness enhanced film.

In another aspect of the present disclosure, the light enhancement layer extends to an area corresponding to the bottom of the opening. An extended portion of the light enhancement layer completely or partially covers the area corresponding to the bottom of the opening.

In still another aspect of the present disclosure, the anode of the pixel unit comprises an indium tin oxide (ITO) electrode. The ITO electrode is disposed on the bottom of the opening. Two ends of the ITO electrode are disposed in the bank layer. The light enhancement layer is disposed between the ITO electrode and the substrate.

In yet another aspect of the present disclosure, the light-emitting layers are formed by inkjet printing.

The present disclosure further provides a method for manufacturing an OLED display panel. The method comprises: forming a light-permeable light enhancement layer and anodes of a plurality of pixel units on a substrate in a first area; coating a bank layer that is negative photoresist on the substrate, and exposing and developing the bank layer to obtain a plurality of openings having a top wider than a bottom, wherein the first area is a peripheral area of the openings; disposing light-emitting layers of the pixel units in the plurality of openings, respectively; forming a cathode of the pixel unit on the top of each of the openings, wherein the light-emitting layer of the pixel unit electrically contacts the anode and the cathode of the pixel unit.

In one aspect of the present disclosure, the light enhancement layer is made of a semi-reflective translucent material or constituted by a brightness enhanced film.

In another aspect of the present disclosure, the light enhancement layer extends to areas corresponding to the bottoms of the openings, extended portions of the light enhancement layer completely or partially cover the areas corresponding to the bottoms of the openings.

In still another aspect of the present disclosure, the anode of the pixel unit comprises a metal electrode and an indium tin oxide (ITO) electrode. The step of forming the light-permeable light enhancement layer and the anodes of the pixel units on the substrate in the first area comprises: forming the metal electrodes on the substrate in the first area, coating the light enhancement layer on the metal electrodes, and forming the ITO electrodes on the light enhancement layer.

In yet another aspect of the present disclosure, the light-emitting layers are formed by inkjet printing, the anodes of the pixel units and the light enhancement layer are formed by physical vapor deposition (PVD), photo, etching, and stripping, the cathodes of the pixel units are formed by evaporation deposition.

Through disposing the light enhancement layer on the OLED display panel in the bank layer around the openings required to be formed, the light intensity on one side of the bank layer around the openings required to be formed close to the substrate is increased when the bank layer is exposed and developed to obtain the openings having the top wider than the bottom. When the light-emitting layers of the pixel units are formed in the openings, the light-emitting material is easy to enter into the openings because the top of the openings is wider than the bottom of the openings to increase the manufacturing efficiency of the light-emitting layers of the OLEDs.

DESCRIPTION OF THE EMBODIMENTS

For the purpose of description rather than limitation, the following provides such specific details as a specific system structure, interface, and technology for a thorough understanding of the application. However, it is understandable by persons skilled in the art that the application can also be implemented in other embodiments not providing such specific details. In other cases, details of a well-known apparatus, circuit and method are omitted to avoid hindering the description of the application by unnecessary details.

Figure 1:
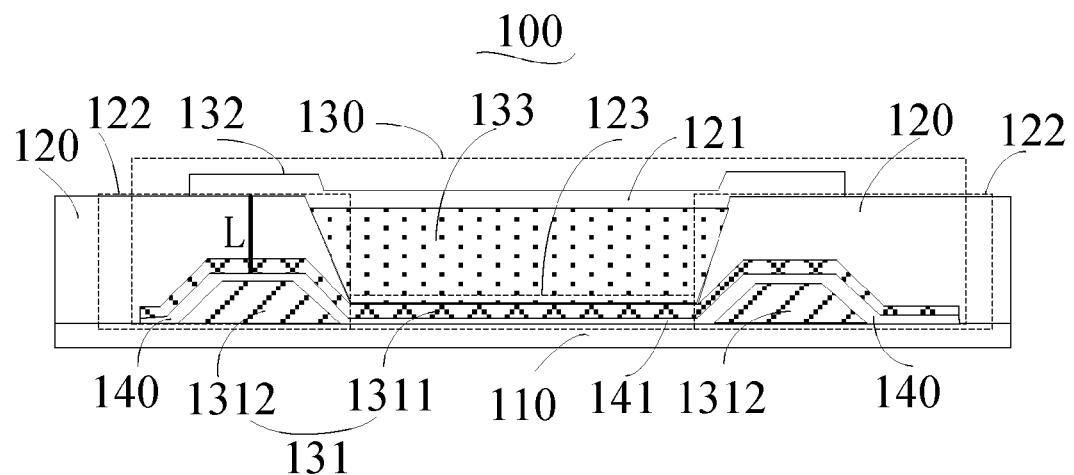
FIG. 1 is a schematic diagram of a structure of an OLED display panel according to one embodiment of the present disclosure.

Refer to FIG. 1, FIG. 1 is a schematic diagram of a structure of an OLED display panel according to one embodiment of the present disclosure. An OLED display panel 100 comprises a substrate 110 and a bank layer 120 and a plurality of pixel units 130 disposed on the substrate 110. The plurality of pixel units 130 are partitioned by the bank layer 120 (in FIG. 1 only the structure of the one pixel unit 130 and the bank layer is shown and taken as an example, structures of other pixel units and the bank layer not shown are consistent with that shown in FIG. 1). Each of the pixel units 130 comprises an anode 131, a cathode 132, and a light-emitting layer 133 sandwiched between the anode 131 and the cathode 132. The light-emitting layer is made of an OLED light-emitting material. When a voltage is formed between the anode 131 and the cathode 132, the light-emitting layer emits light so that display is realized.

The bank layer 120 is negative photoresist and a plurality of openings 121 obtained by exposing and developing the bank layer are formed in the bank layer 120. The openings 121 are used for placing light-emitting layers 133 of the pixel units 130, and a light-permeable light enhancement layer 140 is disposed between the bank layer around the opening 121 (that is, the bank layer located in a peripheral area of the opening 122 shown in FIG. 1) and the substrate 110, such that light intensity on one side of the bank layer around the opening close to the substrate is increased during the exposure and development process. The opening 121 having a top wider than a bottom is thus obtained. The bottom is a side of the opening 121 where the opening 121 is close to the substrate 110, and the top is a side of the opening 121 where the opening 121 is away from the substrate 110.

More specifically, the light enhancement layer 140 may be made of a semi-reflective translucent material or constituted by a brightness enhanced film. In addition, a thickness of the light enhancement layer 140 is less than a specific thickness, such as less than 0.2 millimeters (mm), etc.

For example, the light enhancement layer 140 is the semi-reflective translucent material. Since the light enhancement layer 140 can reflect light, incident light emitted from the bank layer reaches the light enhancement layer 140 and is then emitted during the exposure process, the reflected light reacts with the incident light to generate the microcavity effect. The light intensity is thus increased through the microcavity effect. In the present embodiment, by adjusting a thickness of the bank layer 120, the microcavity effect gradually reduces with the increasing of a microcavity length L. As a result, the closer the bank layer 120 is to the substrate 110, the larger the retained portion is after the bank layer is exposed and developed. The opening 121 having a top wider than a bottom is thus formed because of the bank layer 120 having a larger bottom on both sides of opening 121. The microcavity length L is a distance between a top surface of the light enhancement layer and a top surface of the bank layer 120 (as shown in FIG. 1).

Preferably, a transmittance of the semi-reflective translucent material is greater than a reflectivity of the semi-reflective translucent material. A ratio of the reflectivity to the transmittance may be between 1:200 and 1:10, more specifically, for example 1:200, 1:100, or 1:10. Of course, the transmittance of the semi-reflective translucent material does not need to be greater than the reflectivity of the semi-reflective translucent material, and a material having any reflectivity and transmittance can be adopted depending on practical applications. In one embodiment, the semi-reflective translucent material may be silver (Ag).

Figure 2:
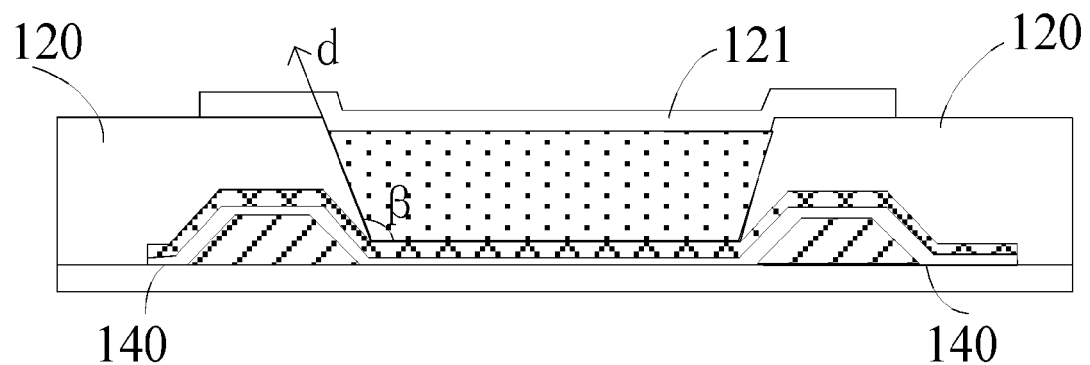
FIG. 2 is a schematic diagram of a structure of an OLED display panel according to another embodiment of the present disclosure.

The light enhancement layer 140 is a brightness enhanced film. Since the brightness enhanced film can intensify light moving along a specific direction, the incident light in the bank layer 120 along a specific direction d, for example along a required inclination angle (that is, tapper) β of the opening 121, can be intensified by disposing the light enhancement layer 140 correspondingly (as shown in FIG. 2, FIG. 2 is a schematic diagram of a structure in which the light enhancement layer 140 is a brightness enhanced film according to one embodiment). Since the energy of the bottom of the bank layer 120 irradiated by light is higher than the energy of a top of the bank layer 120 irradiated by light, the bank layer retained on the bottom is more than that retained on the top, thus forming the opening 121 having the top wider than the bottom.

The light enhancement layer 140 can further extend to an area corresponding to the bottom of the opening 123. As shown in FIG. 1, an extended portion 141 of the light enhancement layer 140 completely covers the area corresponding to the bottom of the opening 123. That is, the light enhancement layer 140 is correspondingly disposed in the peripheral area of the opening 122 and the area corresponding to the bottom of the opening 123 and are connected as a whole.

The cathode 132 of the pixel unit 130 may be disposed on the top of the opening 121 to ensure that the cathode 132 can be electrically contact with or connected to the light-emitting layer 133 in the opening 121. The anode 131 of the pixel unit 130 may be disposed on the bottom of the opening 121 and in the peripheral area of the opening 122 to ensure that the anode 131 can be electrically contact with or connected to the light-emitting layer 133 in the opening 121. The light enhancement layer 140 may be disposed between the anode 131 and the substrate 110, in the anode 131, or on one side of the anode 131 away from the substrate 110. When the light enhancement layer 140 is disposed in the anode 131 or on the one side of the anode 131 away from the substrate 110, the light enhancement layer 140 is a conductive mechanism or the light enhancement layer 140 does not completely cut off the electrical connection or electrical contact between the anode 131 and the light-emitting layer 133. It should be understood that the extended portion 141 of the light enhancement layer 140 can be one part of the light enhancement layer 140, and the above description of the light enhancement layer 140 should be regarded as comprising the extended portion 141.

In greater detail, the anode 131 of the pixel unit 130 may comprise an indium tin oxide (ITO) electrode 1311. The ITO electrode 1311 is disposed on the bottom of the opening 121. Two ends of the ITO electrode 1311 may be disposed in the bank layer 120 in the peripheral area of the opening 122. The light enhancement layer 140 is disposed between the ITO electrode 1311 and the substrate 110. Furthermore, the anode 131 of the pixel unit 130 may comprise a metal electrode 1312. The metal electrode 1312 is disposed in the bank layer 120 in the peripheral area of the opening 122 and can be electrically connected to the ITO electrode 1311 so as to provide the ITO electrode 1311 with a voltage. For example, the metal electrode 1312 is disposed on one side of the ITO electrode 1311 close to the substrate 110, and the electrical connection is realized through the light enhancement layer 140. The light enhancement layer 140 may be a conductive mechanism. Of course, the light enhancement layer 140 may not be a conductive mechanism. The metal electrode 1312 may also be electrically connected to the ITO electrode 1311 through vias in the light enhancement layer.

Optionally, the light-emitting layer 133 of the pixel unit 130 is formed by inkjet printing. The anode 131 of the pixel unit 130 and the light enhancement layer 140 are formed by physical vapor deposition (PVD), photo, etching, and stripping. The cathode 132 of the pixel unit 130 is formed by evaporation deposition.

Figure 3:
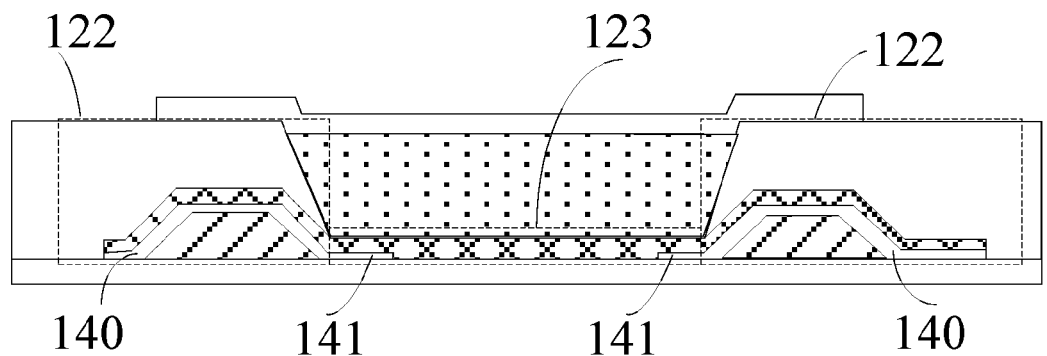
FIG. 3 is a schematic diagram of a structure of an OLED display panel according to still another embodiment of the present disclosure.

Refer to FIG. 3, FIG. 3 is a schematic diagram of a structure of an OLED display panel according to still another embodiment of the present disclosure. The only difference between the present embodiment and the previous embodiment is that the extended portion 141 of the light enhancement layer 140 according to the present embodiment does not completely but only partially covers the area corresponding to the bottom of the opening 123 to increase the light extraction efficiency of the light-emitting layer of the OLED. That is, the light enhancement layer 140 is correspondingly disposed in the peripheral area of the opening 122 and part of the area corresponding to the bottom of the opening 123, and the part of the area corresponding to the bottom of the opening 123 where the light enhancement layer 140 is disposed corresponds to part of the opening 121 in the area corresponding to the bottom of the opening 123 close to the peripheral area of the opening 122.

Figure 4:
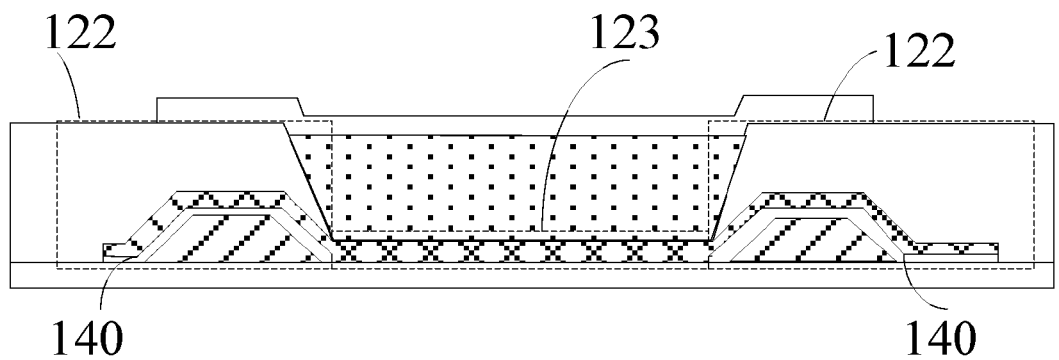
FIG. 4 is a schematic diagram of a structure of an OLED display panel according to yet another embodiment of the present disclosure.

In other embodiments, the light enhancement layer 140 does not necessarily extend to the area corresponding to the bottom of the opening 123. That is, the light enhancement layer 140 is only disposed in the peripheral area of the opening 122 correspondingly, as shown in FIG. 4.

Figure 5:
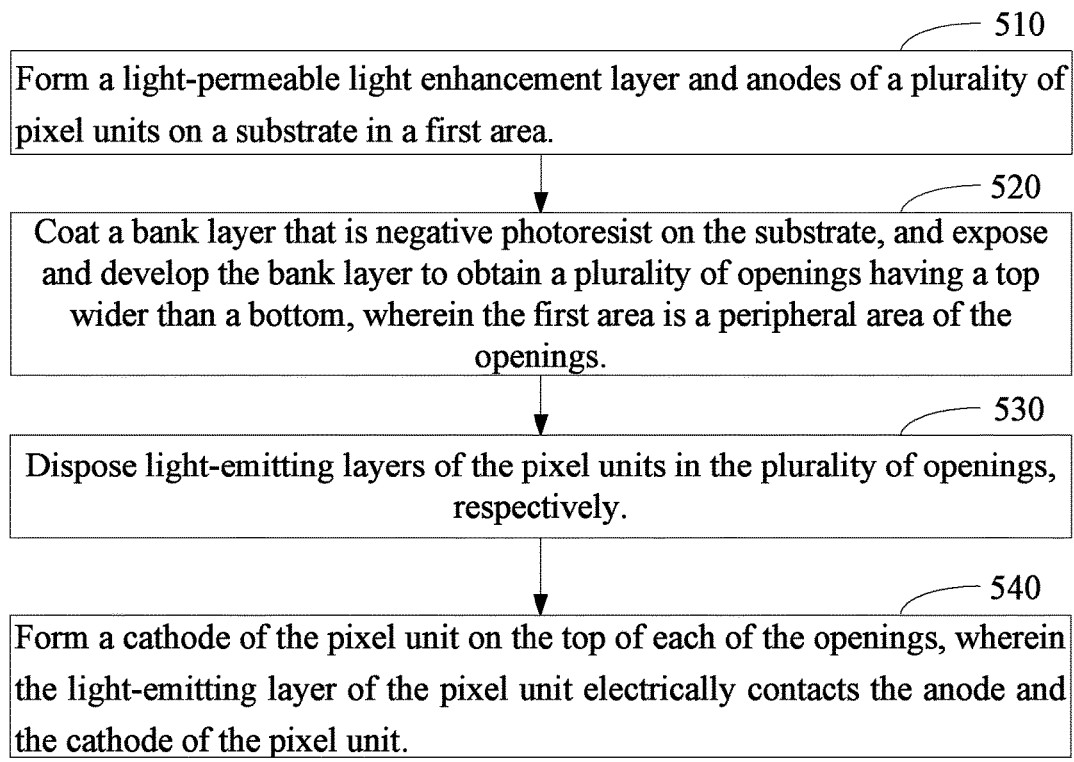
FIG. 5 is a flowchart of a method for manufacturing an OLED display panel according to one embodiment of the present disclosure.

Refer to FIG. 5, FIG. 5 is a flowchart of a method for manufacturing an OLED display panel according to one embodiment. The method comprises:

510: forming a light-permeable light enhancement layer and anodes of a plurality of pixel units on a substrate in a first area.

The first area corresponds to the peripheral area of the openings required to be formed. The light enhancement layer may be disposed between the anodes and the substrate, in the anodes, or on one side of the anodes away from the substrate. When the light enhancement layer is disposed in the anodes or on the one side of the anodes away from the substrate, the light enhancement layer is a conductive mechanism or the light enhancement layer does not completely cut off the electrical connections or electrical contacts between the anodes and the light-emitting layers. The light enhancement layer may be made of a semi-reflective translucent material or constituted by a brightness enhanced film. The light enhancement layer may extend to the areas corresponding to the bottoms of the openings required to be formed. The extended portions of the light enhancement layer completely or partially cover the areas corresponding to the bottoms of the openings required to be formed. The detailed description of the light enhancement layer may be referred to the above description of the light enhancement layer.

Optionally, the anode of the pixel unit comprises a metal electrode and an ITO electrode. Step 510 comprises: forming the metal electrodes on the substrate in the first area; coating the light enhancement layer on the metal electrodes, and forming the ITO electrodes on the light enhancement layer.

520: coating a bank layer that is negative photoresist on the substrate, and exposing and developing the bank layer to obtain a plurality of openings having a top wider than a bottom, wherein the first area is a peripheral area of the openings.

Figure 6:
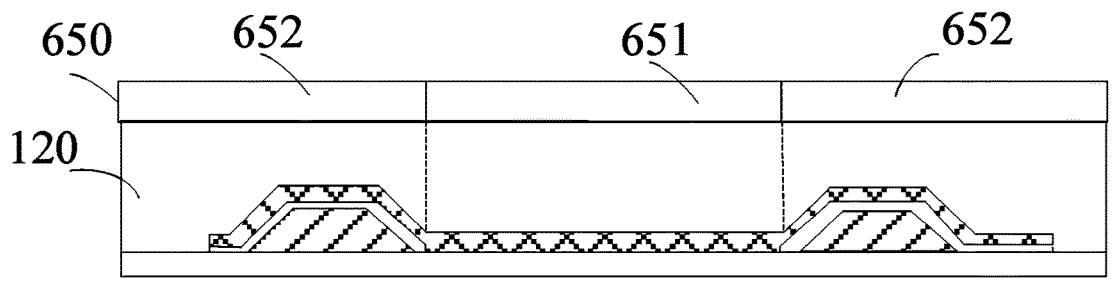
FIG. 6 is a schematic diagram of a structure of an OLED display panel when performing step 520 shown in FIG. 5.

As shown in FIG. 6, the bank layer 120 thus coated is exposed and developed by utilizing a mask 650 to obtain the plurality of openings required to be formed. Opaque areas 651 in the mask 650 correspond to areas where the openings need to be formed. Light openings 652 in the mask 650 correspond to an area where the bank layer is retained.

530: disposing light-emitting layers of the pixel units in the plurality of openings, respectively.

540: forming a cathode of the pixel unit on the top of each of the openings, wherein the light-emitting layer of the pixel unit electrically contacts the anode and the cathode of the pixel unit.

The light-emitting layers are formed by inkjet printing. The anodes of the pixel units and the light enhancement layer are formed by PVD, photo, etching, and stripping. The cathodes of the pixel units are formed by evaporation deposition.

The OLED display panels according to the above embodiments can be formed by utilizing the present embodiment method.

In the above technical schemes, through disposing the light enhancement layer on the OLED display panel in the bank layer around the openings required to be formed, the light intensity on one side of the bank layer around the openings required to be formed close to the substrate is increased when the bank layer is exposed and developed to obtain the openings having the top wider than the bottom. When the light-emitting layers of the pixel units are formed in the openings, the light-emitting material is easy to enter into the openings because the top of the openings is wider than the bottom of the openings to increase the manufacturing efficiency of the light-emitting layers of the OLEDs.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A method for manufacturing an organic light-emitting diode (OLED) display panel comprising:
    forming a light-permeable light enhancement layer and an anode of pixel unit on a substrate in a first area, wherein the light enhancement layer is constituted by a brightness enhanced film;
    coating a bank layer that is negative photoresist on the substrate, and exposing and developing the bank layer to obtain an opening having a top wider than a bottom, wherein the first area is a peripheral area of the opening;
    disposing a light-emitting layer of the pixel unit in the opening, respectively;
    forming a cathode of the pixel unit on the top of the opening, wherein the light-emitting layer of the pixel unit electrically contacts the anode and the cathode of the pixel unit.

2. The method as claimed in claim 1, wherein the light enhancement layer extends to areas corresponding to the bottom of the opening, extended portions of the light enhancement layer completely or partially cover the area corresponding to the bottom of the opening.

3. The method as claimed in claim 1, wherein the anode of the pixel unit comprises a metal electrode and an indium tin oxide (ITO) electrode;
    the step of forming the light-permeable light enhancement layer and the anode of the pixel unit on the substrate in the first area comprises:
    forming the metal electrode on the substrate in the first area;
    coating the light enhancement layer on the metal electrode; and
    forming the ITO electrode on the light enhancement layer.

4. The method as claimed in claim 2, wherein the anode of the pixel unit comprises a metal electrode and an indium tin oxide (ITO) electrode;
    the step of forming the light-permeable light enhancement layer and the anode of the pixel unit on the substrate in the first area comprises:
    forming the metal electrode on the substrate in the first area;
    coating the light enhancement layer on the metal electrode; and
    forming the ITO electrode on the light enhancement layer.

5. The method as claimed in claim 1, wherein the light-emitting layer is formed by inkjet printing, the anode of the pixel unit and the light enhancement layer are formed by physical vapor deposition (PVD), photo, etching, and stripping, the cathode of the pixel unit are formed by evaporation deposition.

\* \* \* \* \*